(12) United States Patent
Fraurud et al.

(10) Patent No.: US 9,742,409 B2
(45) Date of Patent: Aug. 22, 2017

(54) ELECTRONIC ASSEMBLY SUPPORTED BY A PLURALITY OF CARDS

(71) Applicant: AKER SUBSEA LIMITED, Maidenhead, Berkshire (GB)

(72) Inventors: Marius Fraurud, Maidenhead (GB); Svein Birkemoe, Maidenhead (GB); Piet Buyse, Maidenhead (GB)

(73) Assignee: AKER SOLUTIONS LIMITED, London (GB)

( * ) Notice: Subject to any disclaimer, the term of this patent is extended or adjusted under 35 U.S.C. 154(b) by 1 day.

(21) Appl. No.: 14/876,020

(22) Filed: Oct. 6, 2015

(65) Prior Publication Data
US 2016/0100501 A1 Apr. 7, 2016

(30) Foreign Application Priority Data

Oct. 7, 2014 (GB) .................... 1417752.1

(51) Int. Cl.
*H05K 1/14* (2006.01)
*H03K 19/177* (2006.01)
*G06F 1/18* (2006.01)
*H05K 7/14* (2006.01)

(52) U.S. Cl.
CPC ....... *H03K 19/17748* (2013.01); *G06F 1/185* (2013.01); *H05K 7/1477* (2013.01)

(58) Field of Classification Search
CPC . H03K 19/17748; G06F 1/185; H05K 7/1477
USPC .......................... 361/737, 788, 731, 741, 756
See application file for complete search history.

(56) References Cited

U.S. PATENT DOCUMENTS

| | | | | |
|---|---|---|---|---|
| 6,018,501 | A * | 1/2000 | Smith | ................ E21B 47/0001 367/134 |
| 2003/0117893 | A1* | 6/2003 | Bary | .................... G01V 1/3808 367/16 |
| 2004/0262008 | A1 | 12/2004 | Deans et al. | |
| 2005/0143022 | A1* | 6/2005 | Elayda | ................ G06F 17/5054 455/90.3 |
| 2009/0029737 | A1 | 1/2009 | Davis et al. | |
| 2009/0031297 | A1 | 1/2009 | Davis et al. | |
| 2009/0303687 | A1 | 12/2009 | Davis | |
| 2010/0020813 | A1* | 1/2010 | Brekke | ................. H04L 49/353 370/402 |

(Continued)

OTHER PUBLICATIONS

Search Report for GB1417752.1 dated Mar. 6, 2015, four pages.

*Primary Examiner* — Hung S Bui
(74) *Attorney, Agent, or Firm* — Nixon & Vanderhye P.C.

(57) ABSTRACT

A subsea electronics module for use in a subsea well installation, comprising: a backplane connecting a plurality of slots; a plurality of physical cards each supporting an electronic assembly having an identical architecture including a programmable logic module and a memory, the physical cards each being inserted into a respective slot of the backplane; and wherein the identical electronic assembly of each physical card is configured by program instructions stored in the memory thereon to be configured to perform in use a set of electronic functions of one of a plurality of different defined card roles in dependence on either one or both of: the position of the slot into which that card is inserted; an indication of a card role configuration selection for that card.

12 Claims, 3 Drawing Sheets

(56) References Cited

U.S. PATENT DOCUMENTS

| | | | |
|---|---|---|---|
| 2010/0156662 A1* | 6/2010 | Davis | E21B 33/0355 340/855.3 |
| 2012/0120963 A1 | 5/2012 | Davis | |
| 2012/0175122 A1 | 7/2012 | Simpson et al. | |
| 2013/0346736 A1* | 12/2013 | Cook | G06F 9/4416 713/2 |
| 2013/0346756 A1* | 12/2013 | Cook | G06F 21/00 713/189 |

* cited by examiner

| Card type:SCC | Card type:SCC | Card type:SCC | Card type:SCC | Card type:SCC |
| Card Role:A | Card Role:E | Card Role:C | Card Role:E | Card Role:D |
| Slot1 | Slot2 | Slot3 | Slot4 | Slot5 |

Backplane

| Slot6 | Slot7 | Slot8 | Slot9 | Slot10 |
|  | Card type:SCC |  | Card type:SCC | Card type:SCC |
| empty | Card Role:E | empty | Card Role:E | Card Role:E |

Figure 4

ELECTRONIC ASSEMBLY SUPPORTED BY A PLURALITY OF CARDS

This application claims priority to GB 1417752.1 filed 7 Oct. 2014, the entire content of which is hereby incorporated by reference.

FIELD OF THE TECHNOLOGY

The present invention relates generally to subsea electronics modules and methods for assembly and configuration thereof. In particular the present invention relates to subsea electronics modules in which generic printed circuit boards are configurable to perform a number of different card roles.

BACKGROUND

Global energy demand is increasing, which is putting pressure on the oil and gas industry to improve the effectiveness of extraction from mature fields and to explore fields that are smaller and located in more challenging environments, including ultra-deepwater environments. The development of subsea oil and gas fields requires specialised equipment that must be robust and reliable to safeguard both the equipment itself and the environment and to make the exploitation of the subsea hydrocarbons economically feasible. The deployment and repair of subsea equipment requires specialised vessels equipped with diving and robotic equipment and so interventions to replace or repair such equipment is generally very expensive.

To monitor the extraction of product from subsea wells, the environmental conditions therein are monitored by pressure and/or temperature sensors located downhole at the base of the wellbore. In addition, wellhead and wellbore equipment to control the flow of product is electronically controlled by command signals from the wellhead. The electronics for interfacing with this subsea equipment to process the received sensor signals and to control the well equipment are generally provided within a subsea electronic module (SEM) that is disposed within a subsea control module (SCM) provided at the wellhead.

The SEM generally provides a plurality of physical cards that support electronic assemblies (such as printed circuit boards, PCBs) arranged in slots connected by a backplane all contained within a robust housing that can withstand the extreme high pressure environment at the subsea wellhead.

The different types of equipment, instruments and sensors provided downhole that are required to be electronically interfaced with for control and sensor data processing are often supplied from a range of different manufacturers and there has been little standardisation of the electronic operation and interfacing protocols. Thus there is required a different card type to perform each specific role for each specific equipment type from each different manufacturer. This leads to a proliferation of hardware requirements and significantly complicates the SEM design and assembly process to fulfil a desired functional specification for the SEM.

As a result, the SEM normally consists of specific electronic assemblies (cards) dedicated to control a certain type of instrument, actuator or other equipment. Often, the cards must be themselves provided by the manufacturer of the equipment. As a result, for each type of equipment, a specific type of card may be necessary for the SEM to be able to communicate with the equipment, leading to a high number of card variants. The functionality of the card is fixed at the time of subsea deployment and the card type is programmed in the centrally stored configuration database of the SEM to allow it to function.

As a result, when planning the production of a SEM, the designing and assembly process can become complicated due to the large number of different card types that are required and for the requirement for an inventory of the range of card types to be maintained. Furthermore, the supply chain and delivery timescales of these proprietary cards from the equipment manufacturers may not be consistent with the requirements of the assembler of the SEM and so the process of designing and assembling the SEM for performing a control and communication role at a specific wellhead can become cumbersome.

European patent application publication number EP 2 282 005 A2 discloses a SEM including a plurality of separate, different electronic circuits provided on a board, each of which is selectable to be in communication with an input to the SEM. In this way, one of the plurality of circuits provided on the card is used, the others go unused. The plural circuits provided on the board each conform to the circuitry of a different sensor arrangement from a different manufacturer. By providing multiple different electronic circuits for different sensor arrangements from different manufacturers on a single PCB, fewer physical card variants are needed. Nevertheless, the flexibility of these co-located cards is limited and the problem posed by card proliferation on SEM design remains.

It is in this context that the present invention is devised.

SUMMARY

Viewed from one aspect, the present invention provides a subsea electronics module for use in a subsea well installation, comprising: a backplane connecting a plurality of slots; a plurality of physical cards each supporting an electronic assembly having an identical architecture including a programmable logic module and a memory, the physical cards each being inserted into a respective slot of the backplane; and wherein the identical electronic assembly of each physical card is configured by program instructions stored in the memory thereon to be configured to perform in use a set of electronic functions of one of a plurality of different defined card roles in dependence on either one or both of: the position of the slot into which that card is inserted; an indication of a card role configuration selection for that card.

In embodiments, identical electronic assemblies of the physical cards inserted into different slots are configured to perform the different sets of electronic functions of different defined card roles.

In embodiments, the memory of each physical card stores program instructions for configuring the physical card to perform the sets of electronic functions of a plurality of card roles.

In embodiments, the plurality of card roles are usable to configure the subsea electronics module to interface with different wellhead equipment.

In embodiments, the plurality of card roles are usable to configure the subsea electronics module to interface with different wellhead equipment from different equipment manufacturers.

In embodiments, the architecture of the identical electronic assembly generically combines the hardware necessary to interface with the supported different wellhead equipment.

In embodiments, for each card role, the program instructions configure the generic electronic assembly of the card to emulate the set of electronic functions necessary to interface with a given wellhead equipment of a given equipment manufacturer.

In embodiments, the memory of each physical card stores card role configuration mapping data for the subsea electronics module defining for each slot of the backplane one or more permitted card roles.

In embodiments, a physical card inserted into a slot having only one permitted card role according to the configuration mapping, defaults to that card role.

In embodiments, a physical card inserted into a slot having only more than one permitted card role according to the configuration mapping, is further specified by an indication of a card role configuration selection from the permitted card roles.

In embodiments, the indication of a card role configuration selection for that card is set at the time of deployment of the subsea electronics module.

Viewed from another aspect, the present invention provides a method of assembling and configuring a subsea electronics module for deployment, comprising: inserting into each of a plurality of the slots of a backplane of the subsea electronics module physical cards each supporting an electronic assembly having an identical architecture including a programmable logic module and a memory; and wherein the identical electronic assembly of each physical card is configured by program instructions stored in the memory thereon to be configured to perform in use a set of electronic functions of one of a plurality of different defined card roles in dependence on either one or both of: the position of the slot into which that card is inserted; an indication of a card role configuration selection for that card.

In embodiments, the method may further comprise: providing to a card inserted into the subsea electronics module an indicated card role configuration selected for that card.

In embodiments, the method may further comprise: providing to each card to be inserted into the subsea electronics module said program instructions for configuring the electronic assembly to perform in use a set of electronic functions of each of the different defined card roles necessary to interface with the supported different wellhead equipment.

In embodiments, the method may further comprise: providing to each card to be inserted into the subsea electronics module configuration mapping data for the subsea electronics module defining for each slot of the backplane one or more permitted card roles.

In embodiments, the method may further comprise: specifying an intended functionality for the subsea electronics module based on its intended use and the equipment with which it is to interface; generating, using a planning tool, a design configuration for the subsea electronics module specifying the card positions and card roles necessary for the subsea electronics module to perform the intended functionality; and inserting the physical cards into the slots of the backplane in accordance with the design configuration, and configuring the card roles in accordance with the design configuration.

A physical card supporting an electronic assembly for use in slot of a subsea electronics module as claimed in any of claims 1 to 11, comprising: a programmable logic module; and a memory storing program instructions for configuring the electronic assembly to perform in use a set of electronic functions of one of a plurality of different defined card roles in dependence on either one or both of: the position of the slot into which that card is inserted; an indication of a card role configuration selection for that card.

Within the scope of this application it is expressly envisaged that the various aspects, embodiments, examples and alternatives set out in the preceding paragraphs, in the claims and/or in the following description and drawings, and in particular the individual features thereof, may be taken independently or in any combination. Features described in connection with one aspect or embodiment of the invention are applicable to all aspects or embodiments, unless such features are incompatible.

BRIEF DESCRIPTION OF THE DRAWINGS

Aspects of the invention may best be understood by reference to the following description of certain exemplary embodiments together with the accompanying drawings in which:

FIG. 4 shows a configuration mapping of how the card shown in FIG. 3 is configured to perform different card roles in different backplane slots in an Equipment Module.

DETAILED DESCRIPTION OF PREFERRED EMBODIMENTS

Figure 1:
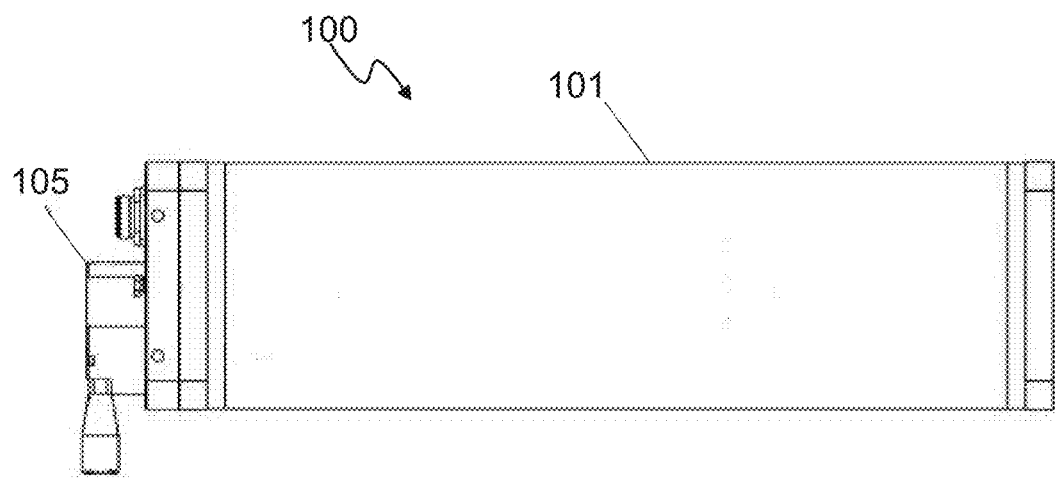
FIG. 1 shows a subsea electronics module in accordance with an embodiment of the invention.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. Furthermore, terms "comprises," "comprising," or any other variation thereof, are intended to cover a non-exclusive inclusion, such that apparatuses and method steps that comprises a list of elements or steps does not include only those elements but may include other elements or steps not expressly listed or inherent. An element or step proceeded by "comprises . . . a" does not, without more constraints, preclude the existence of additional identical elements or steps that comprises the element or step.

To ease the development and deployment of new cards, the present invention introduces a generic physical card type having an electronic assembly thereon for communication with different equipment from different manufacturers. This is achieved by providing in the electronic assembly a hardware architecture which is capable of communicating with all of the different supported equipment from the different manufacturers. Then, program instructions provided on a memory storage of the generic card type in the form of firmware is capable of configuring the card in used to perform a set of electronic functions for a selected one of a plurality of defined card roles, and the different defined card roles allow the electronic assembly to communicate successfully with the different equipment from the different manufacturers. In this way, a generic card type is provided that, by the use of firmware, can be selectively configured to emulate the operation of a plurality of different proprietary cards required in the art for communication with different equipment from different manufacturers.

As will be explained in more detail below, the selecting of the card role by the generic card can be governed by the slot of the backplane into which the card is inserted and/or an indication of a card role configuration for that card.

In this way, a subsea engineer looking to design and assemble a subsea electronics module to fulfil a given functional specification for a given wellhead equipment, can use a planning tool to generate a complete configuration file specifying the card roles for the SEM and can then simply insert the generic card type into the appropriate slots of the SEM and/or indicate selected card roles for the inserted cards.

Thus in accordance with the invention, the provision of generic card types capable of performing sets of electronic functions for a range of card roles to effectively interface with different equipment types from different manufacturers significantly reduces the number of cards needed in the design and assembly of SEMs. In practice it may be possible to specify even a single, generic card type for interfacing with the full range of well equipment. This significantly simplifies the design and production process and the supply chain for the production of subsea electronics modules.

Figure 2:
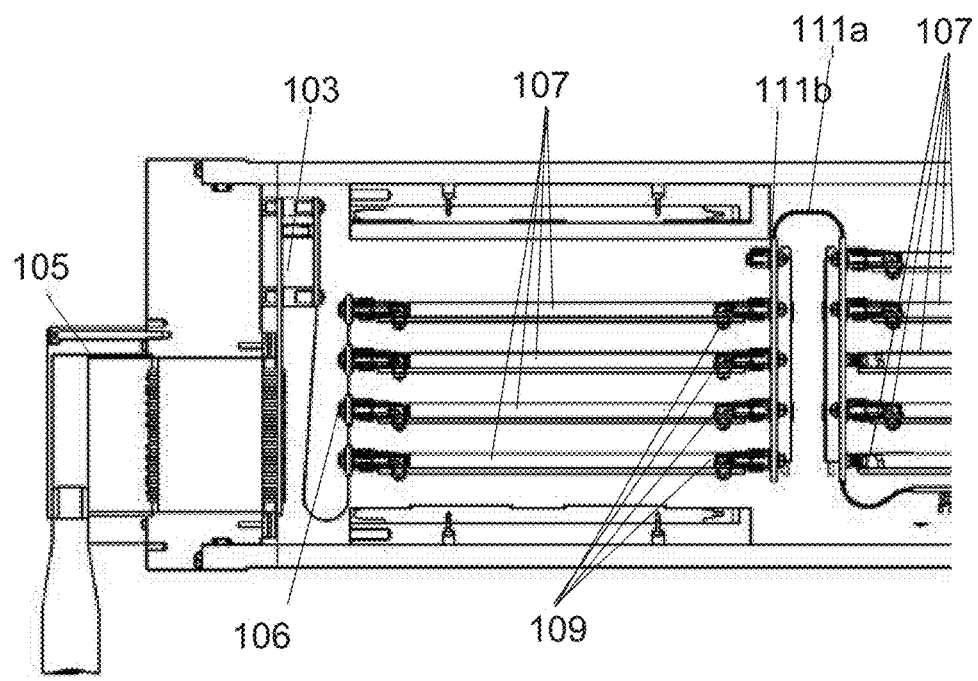
FIG. 2 shows a cross-section showing the inside of the subsea electronics module shown in FIG. 1.

Referring now to FIGS. 1 and 2, a subsea electronics module 100 in accordance with an embodiment of the invention is shown having a generally tubular casing 101 provided around a chassis 103 and an input port 105 at an end of the tubular casing 101 for connection to a subsea control module (SCM) (not shown) mounted on a Christmas tree at the head of a subsea well. Inside the casing 101, a series of physical cards 107 are mounted to the chassis 103 and are connected to slots 109 of a backplane 111.

Figure 3:
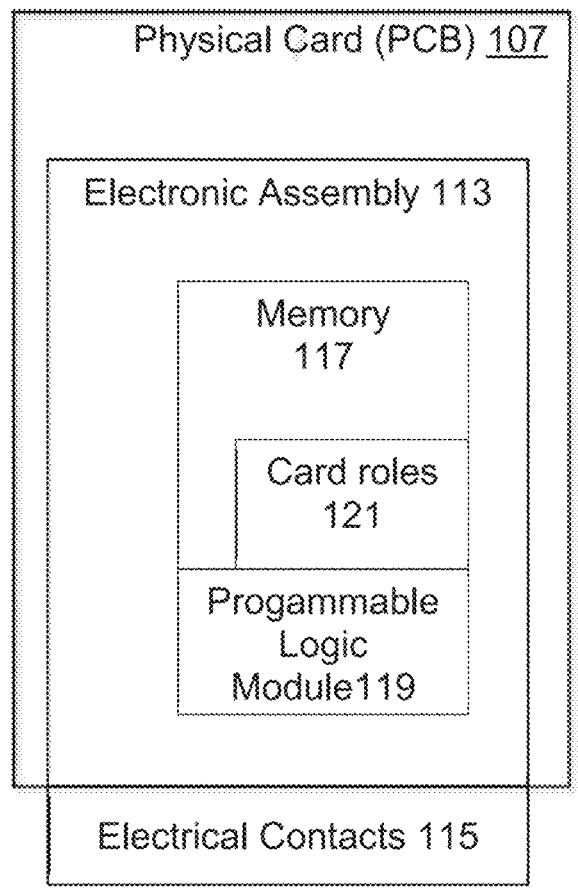
FIG. 3 schematically represents a generic type physical card and electronic assembly in according to an embodiment of the invention.

Referring now also to FIG. 3, the physical cards 107 support electronic assemblies 113 thereon and are provided as printed circuit boards (PCBs) having electrical contacts 115 at one or two opposite edges thereof for contacting with electrical contacts of the backplane 111 arranged in a slot 109. The backplane 111 provides an electronic bus connecting the electronic assemblies provided on the physical cards 107 to each other. The input port 105 is connected in use to receive data inputs from the well equipment for processing by the SEM. A DPC connector board 106 connects the inputs from the port 105 to cards.

The backplane 111 has a flexi-rigid construction of flexible sections formed by ribbon cables 111a and rigid sections formed as printed circuit boards 111b. The backplane 111 may be provided in one or more parts and may be connected through cards 107. The slots 109 of the backplane have numbered positions, which may be electronically detected by the physical cards 107 on insertion into the slot 109, based on the ordering of the slots 109 along the backplane.

Referring now to FIG. 3, in the embodiment, all the physical cards 107 in the SEM have identical electronic assemblies provided thereon and as such, only one generic card type is provided. However, in other embodiments, not all of the physical cards provided in the SEM have identical electronic assemblies. In these alternative embodiments, more than one generic card type may be provided, or some non-generic card types may be provided. In the generic physical card types of the present invention, however, the identical electronic assemblies 113 must be configurable in use to perform one of a set of defined card roles, for which each card role the generic physical card 107 performs a defined set of electronic functions so as to interface with well apparatus of a given type or types from a given manufacturer or manufacturers. More than one card of the said generic card types is typically provided. With the present invention, SEMs having a full range of functional specifications may be designed and provided for interfacing with a range of combinations of different well equipment using only one, or perhaps only two generic card types. Indeed, in accordance with the invention, the same card role may be supported by multiple generic card types.

The architecture of the identical electronic assemblies 113 of a generic card type generically combines the hardware necessary to interface with the supported different wellhead equipment, for example different equipment types supplied from different equipment manufacturers. This is achieved by effectively unifying all the hardware requirements necessary to interface with the supported well equipment into a common architecture. However, different ones of the physical cards 107 having identical electronic assemblies provided in the SEM may be provided with different or additional input ports (for example, fibre optic inputs) on the card for receiving input signals direct from the SCM. The provision of these, or other, additional input (or other) components and circuits does not alter the commonality of the architecture of the core of the electronic assemblies between the cards 107.

Each electronic assembly is provided with a memory 117, which may be for example, a non-volatile memory such as a flash ROM or EEPROM, for storing program instructions thereon, and a programmable logic module 119, which may be, for example, a field programmable gate array (FPGA), capable of carrying out program instructions stored on memory 117.

In use, in order for the identical electronic assemblies 113 of the physical cards 107 of the same card type to interface with different types of well equipment from different manufacturers, the electronic assemblies are configured by program instructions 121 stored in memory 117 to perform sets of electronic functions for defined card roles. For example, in one role the card 107 is configured to process sensor signals received from a well sensor of a given type from a given manufacturer, or to send control signals to given well valves, and so on. The electronic assembly 113 of a given card 107 is configured to carry out the set of electronic functions of one of these card roles by card role program instructions 121 stored in memory 117.

The card role program instructions 121 may be provided as firmware which is stored on the generic cards at the time of manufacture thereof, or at the time of assembly of the SEM. The card role program instructions 121 are capable of configuring each of the generic physical cards 107 of the same type to perform the different sets of electronic functions of a plurality of card roles. The card roles as such define a set of electronic functions for the card 107 to perform when fulfilling that card role. In this way, the generic card type 107 can be caused to emulate the different sets of electronic functions of the varieties of proprietary cards for interfacing with different well equipment from different manufacturers.

In use, the card 107 is configured to perform a set of electronic functions of one of the plurality of different defined card roles in dependence on either one or both of:
  the position of the slot 109 into which that card 107 is inserted;
  an indication of a card role configuration selection for that card 107.

Thus the role a given card 107 fulfils on insertion into the SEM may be governed only by the slot position. Configuration mapping data defining the permitted card roles to the slot numbers may also be stored in memory 117 of each card or in the configuration database of the SEM. The inserted cards may access the stored configuration mapping in the memory or configuration database and, based on their slot position, become configured to perform a given card role for that SEM specification. Thus only the card role needs to be stored in the configuration database of the SEM 100. The card type may not need to be stored.

Where more than one card role is permitted for a given card slot 109, the card role for a card 107 inserted into that slot may be specified on assembly of the SEM using a planning tool or management tool which causes an indication of a card role configuration selection for that card to be stored in the memory 117 of the card 107, or in the configuration database of the SEM 100.

If a card is occupying more than one slot, the role is defined for the relevant set of neighbouring slots.

Providing generic cards capable of being configured by software (based, e.g. on a slot position) of fulfilling different roles has a number of advantages. The card role becomes decoupled from the card type, allowing the role to be supported by different current and future cards. This makes configuration changes in existing installations unnecessary when new card types are introduced which replace previous ones. This is because the new card types will support the same roles with a hardware which may be very different from existing cards. In addition, the test scope is limited to only the functionality defined by a role. Further, the probability of configuration errors is limited, since the role defines a large part of card- and per port configurations. Further still, only most desired function sets are allowed, and unnecessary configuration combinations are removed. Where more than one generic card type is provided, additional flexibility may be achieved during deployment, as different card types may support the same role. Further, the configurability of new card roles, allows new functionality to be introduced to a given hardware architecture without adversely affecting existing functionality.

In an example embodiment, a single card type, the SEM controller card (SCC), has been developed having a single, common hardware architecture that may fulfil the roles A-E in the Equipment Module of a SEM as indicated in Table 1 below. The roles supported by the SCC card define different sets of interface (port) functions for the card as follows:

TABLE 1

Card roles configurable for generic SCC card type

| Card Type | Card Role | Role allowed in EM Slot # |
|---|---|---|
| SCC | Role A: SCC-2xHS + 6xFT-CAN + 2xRS485 | 1 |
|  | Role B: SCC-2xHS + 6xFT-CAN + 1xRS422 | 1 |
|  | Role C: IIC-2xHS + 6xFT-CAN + 2xRS485 | 3, 5 |
|  | Role D: IIC-2xHS + 6xFT-CAN + 1xRS422 | 3, 5 |
|  | Role E: IIC-2xHS + 6xFT-CAN | 2, 4, 7, 9, 10 |

The interface functions supported in the different card roles A-E in Table 1 are:

HS-CAN: High speed Can bus interface

FT-CAN: Fault Tolerant Can bus interface

RS485: Serial interface

RS422: Serial interface

In role C, D and E, the SCC card type effectively poses as an Instrument Interface Card (IIC).

An explanation of the functional specification of the card roles A-E that the SCC card type can be configured to perform is set out in Table 2 below.

TABLE 2

Card role explanations

| Card Role | Explanation of interface functions supported: |
|---|---|
| Role A: SCC-2xHS-CAN + 6xFT-CAN + 2xRS485 | This is the SCC (SEM Controller Card) role, which implements the control of all other cards in the SEM. It maintains the persistent SEM configuration database. As shown above, this role is only allowed to be supported in slot #1. The SCC communicates configuration and monitoring data with all cards in the SEM (slots #2 to #10) via the SEM backplane. The following external interfaces are supported (see interface explanations in previous table): 2xHS-CAN, 6xFT-CAN, 2xRS485. |
| Role B: SCC-2xHS-CAN + 6xFT-CAN + 1xRS422 | This is the SCC (SEM Controller Card) role, which implements the control of all other cards in the SEM. It maintains the persistent SEM configuration database. As shown above, this role is only allowed to be supported in slot #1. The SCC communicates configuration and monitoring data with all cards in the SEM (slots #2 to #10) via the SEM backplane. The following external interfaces are supported (see interface explanations in previous table): 2xHS-CAN, 6xFT-CAN, 1xRS422. |
| Role C: IIC-2xHS-CAN + 6xFT-CAN + 2xRS485 | This is the IIC (Instrument Interface Card) role, which provides interfaces to instruments and other entities supporting the protocols available on the external interfaces. The following external interfaces are supported (see interface explanations in previous table): 2xHS-CAN, 6xFT-CAN, 2xRS485. |
| Role D: IIC-2xHS-CAN + 6xFT-CAN + 1xRS422 | This is the IIC (Instrument Interface Card) role, which provides interfaces to instruments and other entities supporting the protocols available on the external interfaces. The following external interfaces are supported (see interface explanations in previous table): 2xHS-CAN, 6xFT-CAN, 1xRS422 |
| Role E: IIC-2xHS + 6xFT-CAN | This is the IIC (Instrument Interface Card), which provides interfaces to instruments and other entities supporting the protocols available on the external interfaces. The following external interfaces are supported (see interface explanations in previous table): 2xHS-CAN, 6xFT-CAN |

FIG. 4 shows a configuration mapping of how the SCC card is configured to perform different card roles in an Equipment Module based on permitted roles for the slot positions of the backplane, based on configuration mapping data stored in configuration database of SEM 100.

In order to design and assemble an SEM using the generic card types of the present invention, a functional specification for the SEM for a given operational use to interface with given well equipment may be specified in a planning tool.

The planning tool may then generate the configuration mapping, such as shown in FIG. 4 for the SEM to fulfil that functional specification, in which cards of the same type—SCC—are to be inserted into slots 1-5, 7, 9 and 10, and in those slots that cards are configured to operate differently to perform the indicated card roles, i.e. one of A-E. The configuration mapping may be then stored in the configuration database of the SEM 100, or in the memory 117 of the SCC cards 107. On inserting the SCC cards into the ports 109 of backplane 111 of the SEM 100, the SCC cards 107 are caused to be configured by the program instructions 121 stored in memory 117 to perform the roles A-E as indicated in FIG. 4. In this way, only a single card type is needed to interface with a given well equipment assembly.

Selection of roles can be done by configuration from the management interface, as a consequence of the slot position where the card type is located, or a combination of these.

Note that roles in general do not necessarily only apply to cards, but to any electronic assembly in a SEM. E.g. the SEM has subunits outside of the EM which may also have different roles.

The role concept may also be extended to the whole SEM. In this case, a SEM role would define a set of cards/subunits roles and their slot locations. This would potentially give a large reduction in the scope of SEM testing and thus allow for more focused, intensive testing which improves quality.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the scope of the present invention as defined by the appended claims.

The invention claimed is:

1. A subsea electronics module for use in a subsea well installation, said subsea electronics module comprising:
   a backplane connecting a plurality of slots;
   a plurality of physical cards each supporting an electronic assembly having an identical architecture including a programmable logic module and a memory, the physical cards each being inserted into a respective slot of the backplane;
   wherein the identical electronic assembly of each physical card is configured by program instructions stored in the memory thereon to be configured to perform in use a set of electronic functions of one of a plurality of different defined card roles in dependence on either one or both of:
   the position of the slot into which that card is inserted;
   an indication of a card role configuration selection for that card; and
   wherein the indication of a card role configuration selection for that card is set at the time of deployment of the subsea electronics module.

2. The subsea electronics module as claimed in claim 1, wherein identical electronic assemblies of the physical cards inserted into different slots are configured to perform the different sets of electronic functions of different defined card roles.

3. The subsea electronics module as claimed in claim 1, wherein the memory of each physical card stores program instructions for configuring the physical card to perform the sets of electronic functions of a plurality of card roles.

4. The subsea electronics module as claimed in claim 1, wherein the plurality of card roles are usable to configure the subsea electronics module to interface with different wellhead equipment.

5. The subsea electronics module as claimed in claim 4, wherein the architecture of the identical electronic assembly generically combines the hardware necessary to interface with the supported different wellhead equipment.

6. The subsea electronics module as claimed in claim 5, wherein for each card role, the program instructions configure the generic electronic assembly of the card to emulate the set of electronic functions necessary to interface with a given wellhead equipment of a given equipment manufacturer.

7. The subsea electronics module as claimed in claim 5, wherein a physical card inserted into a slot having only one permitted card role according to the configuration mapping, defaults to that card role.

8. The subsea electronics module as claimed in claim 1, wherein the plurality of card roles are usable to configure the subsea electronics module to interface with different wellhead equipment from different equipment manufacturers.

9. The subsea electronics module as claimed in claim 1, wherein the memory of each physical card stores card role configuration mapping data for the subsea electronics module defining for each slot of the backplane one or more permitted card roles.

10. The physical card supporting an electronic assembly for use in slot of a subsea electronics module as claimed in claim 1, comprising:
    a programmable logic module; and
    a memory storing program instructions for configuring the electronic assembly to perform in use a set of electronic functions of one of a plurality of different defined card roles in dependence on either one or both of:
    the position of the slot into which that card is inserted;
    an indication of a card role configuration selection for that card.

11. A subsea electronics module for use in a subsea well installation, said subsea electronics module comprising:
    a backplane connecting a plurality of slots;
    a plurality of physical cards each supporting an electronic assembly having an identical architecture including a programmable logic module and a memory, the physical cards each being inserted into a respective slot of the backplane;
    wherein the identical electronic assembly of each physical card is configured by program instructions stored in the memory thereon to be configured to perform in use a set of electronic functions of one of a plurality of different defined card roles in dependence on either one or both of:
    the position of the slot into which that card is inserted,
    an indication of a card role configuration selection for that card;
    wherein the plurality of card roles are usable to configure the subsea electronics module to interface with different wellhead equipment;

wherein the plurality of card roles are usable to configure the subsea electronics module to interface with different wellhead equipment from different equipment manufacturers; and wherein a physical card inserted into a slot having only more than one permitted card role according to a configuration mapping thereof, is further specified by an indication of a card role configuration selection from the permitted card roles.

12. A subsea electronics module for use in a subsea well installation, said subsea electronics module comprising:

a backplane connecting a plurality of slots;

a plurality of physical cards each supporting an electronic assembly having an identical architecture including a programmable logic module and a memory, the physical cards each being inserted into a respective slot of the backplane;

wherein the identical electronic assembly of each physical card is configured by program instructions stored in the memory thereon to be configured to perform in use a set of electronic functions of one of a plurality of different defined card roles in dependence on either one or both of:

the position of the slot into which that card is inserted, an indication of a card role configuration selection for that card;

wherein the memory of each physical card stores card role configuration mapping data for the subsea electronics module defining for each slot of the backplane one or more permitted card roles; and wherein a physical card inserted into a slot having only more than one permitted card role according to the configuration mapping, is further specified by an indication of a card role configuration selection from the permitted card roles.

* * * * *